(12) United States Patent
Wang

(10) Patent No.: US 11,448,712 B2
(45) Date of Patent: Sep. 20, 2022

(54) MULTI-CHANNEL ATOMIC MAGNETIC DETECTOR

(71) Applicants: COGNITIVE MEDICAL IMAGING LTD., Beijing (CN); INSTITUTE OF BIOPHYSICS, CHINESE ACADEMY OF SCIENCES, Beijing (CN)

(72) Inventor: Fan Wang, Beijing (CN)

(73) Assignees: COGNITIVE MEDICAL IMAGING LTD., Beijing (CN); INSTITUTE OF BIOPHYSICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 17/312,722

(22) PCT Filed: Dec. 9, 2019

(86) PCT No.: PCT/CN2019/124051
§ 371 (c)(1),
(2) Date: Jun. 10, 2021

(87) PCT Pub. No.: WO2020/119642
PCT Pub. Date: Jun. 18, 2020

(65) Prior Publication Data
US 2022/0018910 A1 Jan. 20, 2022

(30) Foreign Application Priority Data
Dec. 10, 2018 (CN) .......................... 201811503710.0

(51) Int. Cl.
*G01R 33/32* (2006.01)
*G01R 33/032* (2006.01)
*G01R 33/022* (2006.01)

(52) U.S. Cl.
CPC ......... *G01R 33/032* (2013.01); *G01R 33/022* (2013.01)

(58) Field of Classification Search
CPC .......................... G01R 33/00; G01R 33/0035; G01R 33/0023; G01R 33/0017; G01R 31/3191;
(Continued)

(56) References Cited

U.S. PATENT DOCUMENTS 8,212,556 B1 7/2012 Schwindt et al.
9,958,514 B2 * 5/2018 Hokari ................ G01R 33/032
(Continued)

FOREIGN PATENT DOCUMENTS

CN 209460386 U 10/2019
DE 102010020863 B4 4/2016
(Continued)

OTHER PUBLICATIONS

Extended European Search Report dated Jul. 28, 2022 received in European Patent Application No. EP 19894816.8.

*Primary Examiner* — Jermele M Hollington
*Assistant Examiner* — Taqi R Nasir
(74) *Attorney, Agent, or Firm* — Scully Scott Murphy & Presser

(57) ABSTRACT

Disclosed is a multi-channel atomic magnetic detector (100), including at least one detection assembly, with each detection assembly including a plurality of detection air chambers (130) in the same plane and a light-splitting member (110) for allocating polarized beams from a light source (180) to each detection air chamber (130) in the detection assembly, wherein the plurality of detection air chambers (130) of each detection assembly are arranged in a centrally symmetric manner or an axially symmetric manner relative to the light-splitting member (110). The
(Continued)

multi-channel atomic magnetic detector (100) has a high detection density and is beneficial for noise reduction.

17 Claims, 6 Drawing Sheets

(58) Field of Classification Search
CPC .... G01R 33/032; G01R 33/022; G01B 7/004; G01C 17/38; G06F 3/017; G06F 3/0346; G06F 3/012
See application file for complete search history.

(56) References Cited

U.S. PATENT DOCUMENTS

2012/0249132 A1 10/2012 Hokari
2014/0206981 A1 7/2014 Nagasaka
2017/0356969 A1* 12/2017 Ueno .................. G01R 33/243
2017/0363695 A1 12/2017 Ueno

FOREIGN PATENT DOCUMENTS

| | | |
|---|---|---|
| JP | H04-104243 A | 4/1992 |
| JP | 2007-167616 A | 7/2007 |
| JP | 2011242324 A | 12/2011 |
| JP | 2013-242295 A | 12/2013 |
| JP | 2014-215151 A | 11/2014 |
| JP | 2015-099152 A | 5/2015 |
| JP | 2016-050837 A | 4/2016 |
| JP | 2016109665 A | 6/2016 |
| JP | 2018-004462 A | 1/2018 |
| WO | 2012038948 A2 | 3/2012 |

* cited by examiner

MULTI-CHANNEL ATOMIC MAGNETIC DETECTOR

The present application is a national stage of PCT International Application No. PCT/CN2019/124051, filed on Dec. 9, 2019, which claims priority of Chinese Patent Application No. 201811503710.0, filed on Dec. 10, 2018, the disclosure of which is incorporated herein by reference in its entirety as part of the present application.

TECHNICAL FIELD

The present invention relates to an atomic magnetic detector, in particular to a multi-channel atomic magnetic detector.

BACKGROUND

Optically pumped atomic detection technology is a technology of measuring weak magnetic field by polarizing atomic gas with light beam and utilizing the magnetic effect of atomic spin. Since the 1990s, with the discovery of new physical effects, new manipulation principles and methods of atomic spins, especially since 2002, when humans began to manipulate atomic spins to achieve a spin exchange relaxation free (SERF) state, the research of ultra-sensitive magnetic field measurement based on the precession of atomic spins in SERF state has attracted people's attention. This method can greatly exceed the sensitivity achieved by the existing related measurement methods, and make human beings gain a new tool to know the world. Atomic magnetometers (i.e., atomic magnetic detectors) based on optically pumped atomic detection technology can work at room temperature, without liquid helium cooling, with small size and light weight, and can be mass-produced with low cost through semiconductor process, which brings new dawn to magnetoencephalogram, magnetocardiogram and weak magnetic detection in other fields of medicine, biology and materials.

SERF mechanism was first discovered by Professor Happer of Princeton University in 1973. In 2002, the group led by Professor Romalis of Princeton University demonstrated the atomic magnetometer based on SERF principle for the first time. The sensitivity of single channel reached 7 fT/Hz1/2, and now it reached 0.16 fT/Hz1/2, exceeding the level that the best SQUID magnetometer can achieve (0.91 fT/Hz1/2).

Chinese patent publication CN108459282A describes an atomic magnetometer/magnetic gradiometer, which includes a detection air chamber, a laser light source, a modulation coil and a detection device. The excitation beam generated by the laser source polarizes the alkali metal vapor in the detection air chamber, and the modulation coil generates a modulated magnetic field with known intensity for the alkali metal vapor. The detection beam generated by the laser source passes through the alkali metal vapor and is detected by the detection device, so as to obtain the intensity or gradient information of the magnetic field to be detected at the detection air chamber based on the modulated magnetic field. In a single atomic magnetometer/magnetic gradiometer, only one detection air chamber is included, that is, it is of single-channel detection.

SUMMARY

At least one embodiment of the present disclosure provides a multi-channel atomic magnetic detector, which includes at least one detection assembly, each detection assembly includes: a plurality of detection air chambers on a same plane; and a light splitting member for distributing a polarized light beam from a light source to the plurality of detection air chambers, wherein the plurality of detection air chambers of each detection assembly are symmetrically or symmetrically arranged relative to a center of the light splitting member.

In an embodiment, the light splitting member is used for distributing a polarized light beam from a same light source to each detection air chamber in the detection assembly.

In an embodiment, the plurality of detection air chambers of each detection assembly are axisymmetrically arranged relative to the light splitting member. And, the light splitting member distributes each polarized light beam of a plurality of polarized light beam from a plurality of light sources to the detection air chambers of the plurality of detection air chambers which are axisymmetric to each other, wherein each detection air chamber receives at least one polarized light beam.

Furthermore, in an embodiment, at least a part of the plurality of detection air chambers may receive two polarized light beams or a broadened wide polarized light beam.

In an embodiment, the multi-channel atomic magnetic detector further includes a housing for accommodating the at least one detection assembly.

In an embodiment, the light source is accommodated within the housing.

In an embodiment, the light source is arranged outside the housing.

In an embodiment, each detection assembly further includes a plurality of photoelectric detectors for detecting information of a polarized light beam passing through the corresponding detection air chamber, the plurality of photoelectric detectors are arranged behind the corresponding detection air chambers on an optical path, and are also symmetrical or axisymmetric relative to the center of the light splitting member.

In an embodiment, each detection assembly further includes a plurality of polarization devices for converting a polarized light beam into a circularly polarized light beam, which are arranged between the light splitting member and the corresponding detection air chamber on an optical path and are also symmetrical or axisymmetric relative to the center of the light splitting member.

In an embodiment, each detection assembly includes a modulation coil, and the plurality of detection air chambers of each detection assembly share a same group of modulation coils.

In this embodiment, because the plurality of detection air chambers share the same group of modulation coils, the crosstalk problem caused by using a plurality of groups of modulation coils is avoided, and the volume of the detector is reduced.

In another embodiment, each detection assembly further includes a plurality of groups of modulation coils, and each group of modulation coils is arranged for each detection air chamber and is cooperatively controlled by a common controller.

In this embodiment, the cooperative control of the plurality of groups of modulation coils helps to reduce the crosstalk.

In an embodiment, the atomic magnetic detector includes two or more detection assemblies, the two or more detection assemblies are respectively arranged on different planes which are parallel to each other and offset from each other.

In an embodiment, the atomic magnetic detector includes two or more detection assemblies, the two or more detection assemblies are arranged on the same plane and offset from each other in the plane.

In an embodiment, the light splitting members of the two or more detection assemblies distribute a common polarized light beam from a common light source to each detection air chamber.

In this embodiment, each detection air chamber of two or more detection assemblies uses light originating from a common polarized light beam, and therefore, it can be advantageous to reduce detection noise.

In an embodiment, each detection assembly includes four detection air chambers which are evenly spaced and symmetrically arranged relative to the light splitting member on the same plane.

In an embodiment, each detection assembly includes two detection air chambers which are axisymmetrically arranged relative to the light splitting member on the same plane.

In an embodiment, each detection assembly includes four detection air chambers which are axisymmetrically arranged on two sides of the light splitting member on the same plane, wherein two detection air chambers on one side are adjacent to each other and two detection air chambers on the other side are adjacent to each other.

BRIEF DESCRIPTION OF THE DRAWINGS

In order to explain the technical scheme of the embodiments of the present disclosure more clearly, the following drawings which need to be used in the embodiments will be briefly introduced. It should be understood that the following drawings only illustrate some embodiments of the present disclosure, so they should not be regarded as limiting the scope. For those of ordinary skill in the art, other related drawings can be obtained according to these drawings without paying creative labor.

DETAILED DESCRIPTION

Figure 1A:
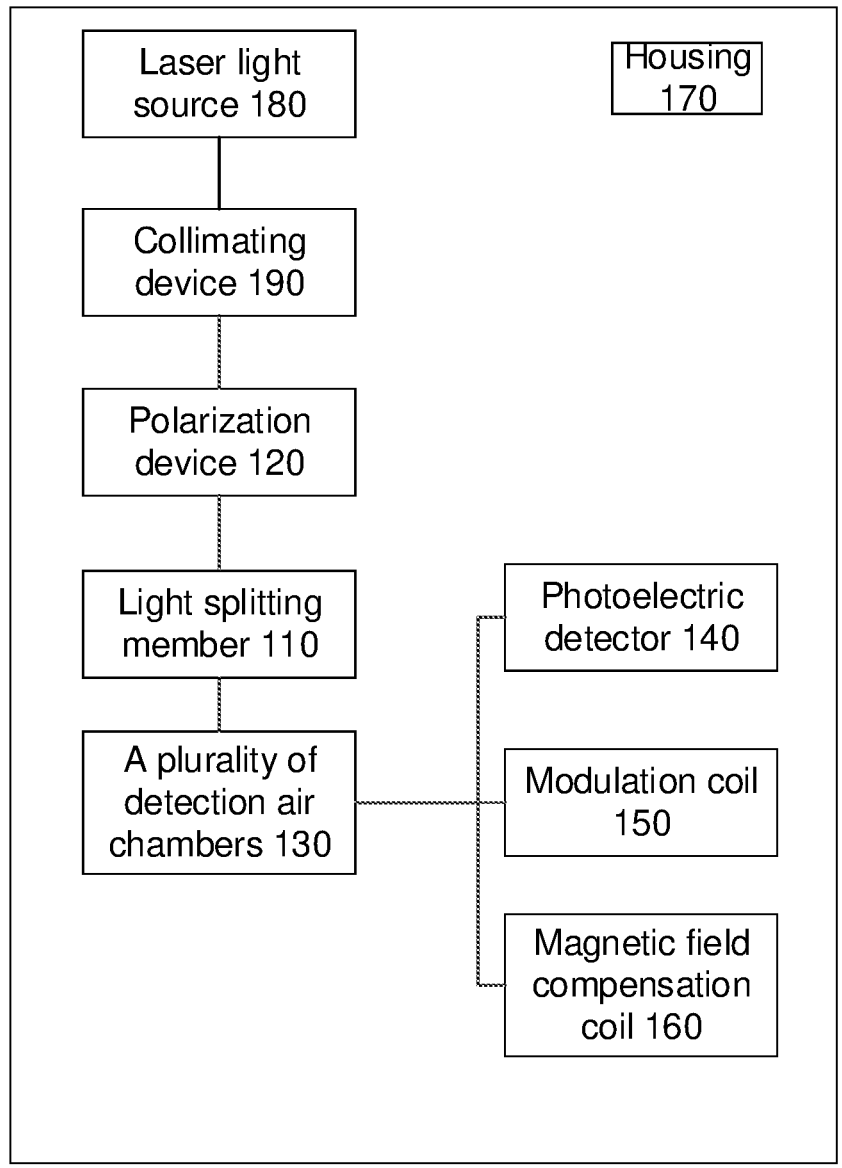
FIG. 1A illustrates a schematic block diagram of an atomic magnetic detector according to an embodiment of the present disclosure.

Next, an atomic magnetic detector according to an embodiment of the present disclosure will be described in detail with reference to the accompanying drawings. In order to make the objectives, technical solutions and advantages of the embodiments of the present disclosure clearer, the technical solutions in the embodiments of the present disclosure will be described clearly and completely with reference to the drawings in the embodiments of the present disclosure. Obviously, the described embodiments are part of the embodiments of the present disclosure, not all of them.

Therefore, the following detailed description of the embodiments of the present disclosure provided with reference to the accompanying drawings is not intended to limit the claimed scope of the present disclosure, but only represents selected embodiments of the present disclosure. Based on the embodiments in the present disclosure, all other embodiments obtained by those of ordinary skill in the art without creative labor belong to the protection scope of the present disclosure. In addition, description of well-known functions and structures may be omitted for clarity and conciseness.

Terms and words used in the following description and claims are not limited to the bibliographic meaning thereof, but are used by the disclosing party to convey a clear and consistent understanding of the present disclosure. Therefore, it should be understood by those skilled in the art that the following description of various embodiments of the present disclosure is for illustrative purposes only, and not for the purpose of limiting the present disclosure as defined by the appended claims and their equivalents.

As used in the present disclosure, the use of "one embodiment" or "this embodiment" does not mean that features described in one embodiment of the present disclosure may only be used for this embodiment, but features of one embodiment may also be used for other embodiments or combined with features in other embodiments to obtain yet another embodiment, and all these embodiments should fall within the protection scope of the present disclosure.

At present, all miniaturized atomic magnetic detectors are single-channel magnetometers or magnetic gradiometers, which are limited by housing size, processing difficulty, crosstalk of modulation coils and other factors, and the density of detection points is low, so it is difficult to measure high density. In addition, each magnetometer or magnetic gradiometer uses an independent light source, which not only has a high manufacturing cost per channel, but also has a large difference in signal background noise level between detectors because of the difference in light intensity and polarization between different light sources, which makes it difficult to obtain good results when performing gradient calculation for proximate detectors and noise reduction processing.

Some embodiments of the present disclosure provide a multi-channel atomic magnetic detector, which includes at least one detection assembly, each detection assembly includes: a plurality of detection air chambers on the same plane; and a light splitting member for distributing a polarized light beam from a light source to the plurality of detection air chambers, wherein the plurality of detection air chambers of each detection assembly are arranged symmetrically or axisymmetrically relative to the center of the light splitting member.

Because the plurality of detection air chambers are symmetrically or axisymmetrically arranged relative to the center of the light splitting member and receive the light splitting of the light splitting member, multi-channel detection is realized. The atomic magnetic detector is simple in structure, high in detection density and easy to suppress noise, and the relative positions of the plurality of detection air chambers are fixed.

Figure 2:
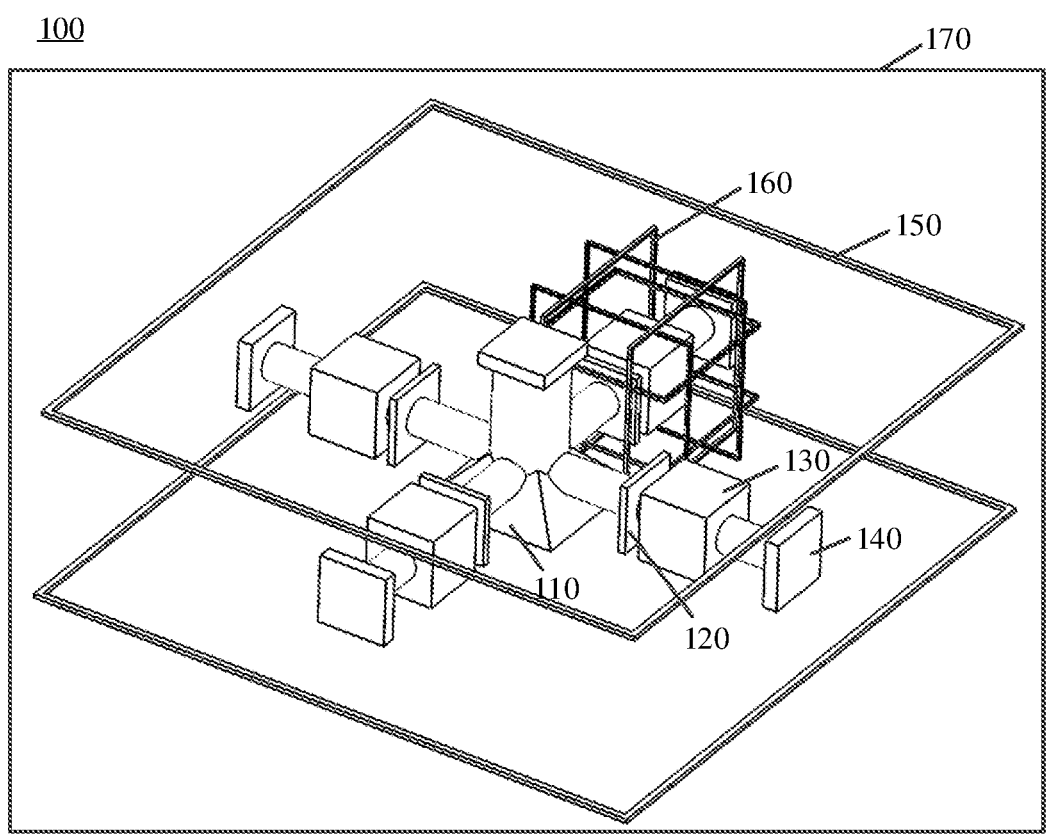
FIG. 2 illustrates a perspective view of the atomic magnetic detector illustrated in FIG. 1A.

FIG. 1A illustrates a schematic block diagram of an atomic magnetic detector 100 according to an embodiment of the present disclosure. FIG. 2 illustrates a perspective view of the atomic magnetic detector 100 illustrated in FIG. 1A.

As illustrated in FIG. 1A and FIG. 2, the atomic magnetic detector 100 includes one detection assembly, the detection assembly includes a light splitting member 110, a polarization device 120, a detection air chamber 130, a photoelectric detector 140, a modulation coil 150, a magnetic field compensation coil 160 and a housing 170. The housing 170 accommodates the light splitting member 110, the polarization device 120, the detection air chamber 130, the photoelectric detector 140, the modulation coil 150 and the magnetic field compensation coil 160. It should be noted that in other embodiments, the atomic magnetic detector 100 may include a plurality of detection assemblies, and the housing 170 accommodates the plurality of detection assemblies.

In this embodiment, there are four detection air chambers 130, the four detection air chambers 130 are arranged on the same plane and symmetrically arranged relative to the center of the light splitting member 110, and the four detection air chambers 130 share the light splitting member 110.

In this embodiment, a plurality of detection air chambers 130 are included within the housing 170 of the atomic magnetic detector 100, which effectively realizes multi-channel magnetic intensity or magnetic gradient detection. Because the plurality of detection air chambers 130 are symmetrically arranged around the center of the same light splitting member 110 and receive light split from the light splitting member 110, the detection density is significantly improved, and the relative positions of the plurality of detection air chambers 130 in the atomic magnetic detector 100 are ensured to be fixed and stable. In addition, this centrally symmetrical arrangement has simple structural design and low assembly and manufacturing costs.

The atomic magnetic detector may further include a laser light source 180 (see FIG. 1A) and a collimating device 190 (see FIG. 1A). The laser light source 180 is used to generate a polarized light beam with specific wavelength and polarization characteristics as required, and the polarized light beam is incident into the light splitting member 110 after processing such as collimation. The light splitting member 110 distributes the received polarized light beam to each detection air chamber 130. In this example, one laser light source 180 generates one polarized light beam, and the light splitting member 110 distributes the polarized light beam to each detection air chamber 130.

In an embodiment, four detection air chambers 130 symmetrically arranged and evenly spaced around the center of the light splitting member 110 share the same light splitting member 110, to use the same polarized light beam from the same light source. Therefore, compared with the case where the plurality of detection air chambers 130 use different polarized light beams from different light sources, the influence of different noises among polarized light beams on magnetic information detection is eliminated or reduced, and the noise reduction efficiency is improved, which is particularly advantageous when the atomic magnetic detector 100 is based on magnetic gradient measurement as the gradient noise reduction efficiency is improved.

In this example, the atomic magnetic detector 100 includes a laser light source 180 arranged inside the housing 170, and the four detection air chambers 130 share the same laser light source 180. In this example, because the plurality of detection air chambers 130 share the same laser light source 180, the number and cost of laser light source 180 are reduced, and the volume occupied by the atomic magnetic detector 100 is reduced and the detection density is higher. The laser light source 180 shared by the plurality of detection air chambers 130 is not limited to one. For example, in some examples, the plurality of detection air chambers 130 may share more than one (e.g., two) laser light sources 180.

Furthermore, in some examples, in addition to one laser light source 180, the atomic magnetic detector 100 may also include another standby laser light source 180.

Figure 1B:
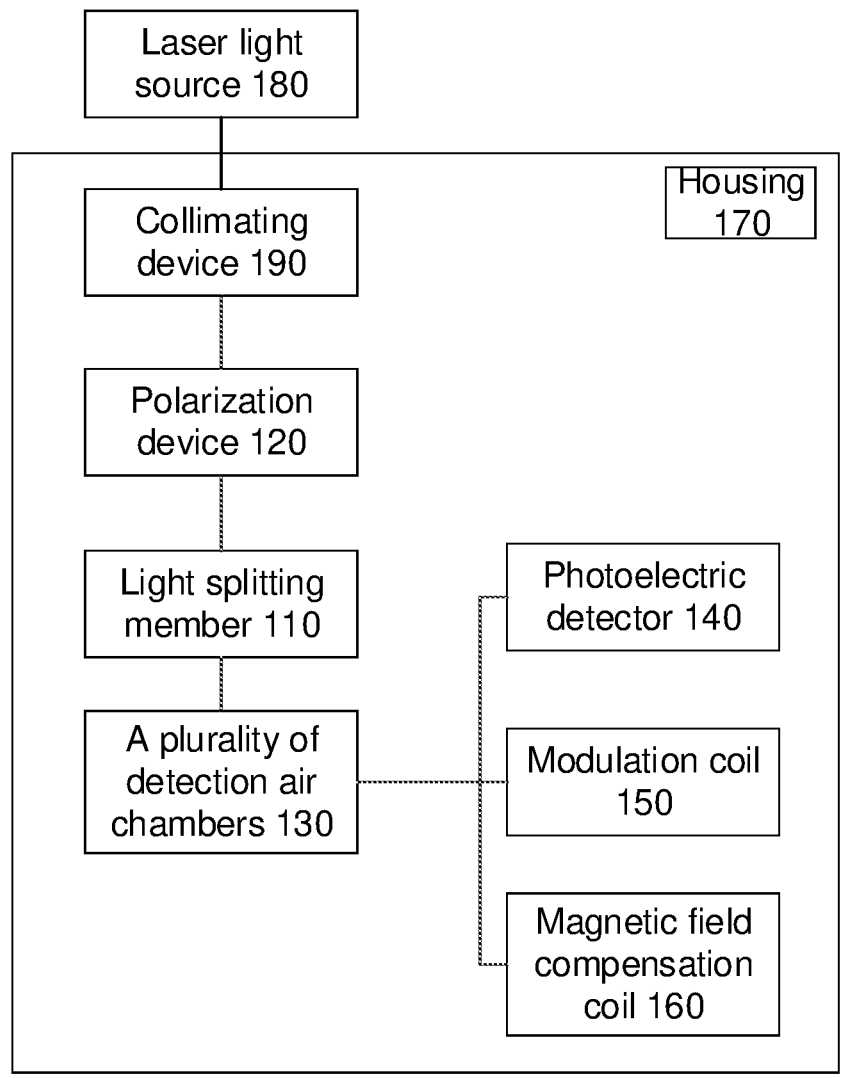
FIG. 1B illustrates a schematic block diagram of an atomic magnetic detector according to another embodiment of the present disclosure.

In other examples, the laser light source 180 may be arranged outside the housing 170, as illustrated in FIG. 1B, and then the polarized light beam generated by the laser light source 180 is guided to the light splitting member 110 through a light guiding device such as an optical fiber. In this example, the plurality of detection air chambers 130 share the light splitting member 110 and receive the polarized light beams originating from the same polarized light beam, so it is also beneficial to reduce the occupied volume of the atomic magnetic detector 100 and make it have a higher detection density, and it is also beneficial to reduce the detection noise.

As illustrated in FIG. 2, the light splitting member 110 may be a pyramid prism having four 45-degree inclined planes. Each inclined plane faces one detection air chamber 130, so that the light splitting member 110 reflects the received polarized light beam propagating in the vertical direction into a plurality of polarized light beams propagating in the horizontal direction at right angles to the vertical direction and distributes each polarized light beam to each corresponding detection air chamber 130.

The detection air chamber 130 contains alkali metal gas. Polarized light beams may be used to polarize alkali metal atoms and to detect precession behavior of the alkali metal atoms. The modulation coil 150 is used to generate a modulated magnetic field of known strength, the modulated magnetic field of known strength is superimposed with the detected magnetic field to act on polarized alkali metal atoms together. The polarized light beam for detection passes through the detection air chamber 130 to interact with alkali metal atoms, so that the polarization state of the light field of the polarized light beam changes.

For example, in this embodiment, there are four photoelectric detectors 140. Each photoelectric detector 140 is arranged behind each detection air chamber 130 on the optical path, and is also centrally symmetrical relative to the light splitting member 110. The photoelectric detectors 140 each receive and detect polarized light beam passing through the corresponding detection air chambers 130 to obtain information related to the magnetic field to be measured at the detection air chambers 130, such as magnetic intensity information or magnetic gradient information.

In addition, for example, there are four polarization devices 120, and each polarization device 120 is arranged between the light splitting member 110 and the detection air chamber 130 on the optical path for converting the polarized light beam to be guided to the detection air chamber 130 into a circularly polarized light beam. The polarization device 120 may be a quarter-wave plate.

In this embodiment, four detection air chambers 130 share one group of modulation coils 150. One group of modulation coils 150 represents one or more pairs of modulation coils 150 that work together to generate an effective modulation magnetic field. For example, in this example, one group of modulation coils 150 may be a single pair of coils, or it may be three pairs of coils arranged in three directions perpendicular to each other.

It is advantageous for the four detection air chambers 130 to share one group of modulation coils 150, which can reduce the use cost of coils, eliminate the crosstalk among a plurality of modulation coils 150 generated when each detection air chamber 130 uses separated modulation coils 150, and make the detection air chambers 130 in the atomic magnetic detector 100 closer to each other. Compared with the traditional single-channel atomic magnetic detector, the atomic magnetic detector 100 according to this embodiment has high detection density and small occupied volume.

In addition, it should be noted that it is not necessary for the four detection air chambers 130 to share one group of modulation coils 150, and the present disclosure is not limited thereto. In other examples, the atomic magnetic detector 100 may have four groups of modulation coils for the four detection air chambers 130 respectively. The four groups of modulation coils are cooperatively controlled by a common controller to carry out multi-channel detection and reduce crosstalk.

According to this embodiment, the atomic magnetic detector 100 further includes four groups of magnetic compensation coils 160. For the sake of clarity, only one group of magnetic compensation coils 160 arranged around one detection air chamber 130 is illustrated in FIG. 2, while the other three groups of magnetic compensation coils 160 respectively arranged around the other three detection air chambers are omitted. Each group of magnetic compensation coils 160 is used to compensate the magnetic field of each detection air chamber 130 to offset the environmental noise magnetic field. In this example, the magnetic compensation coils 160 are three pairs of Helmholtz coils.

In addition, in other embodiments, the modulation coil 150 may also be used as a compensation coil for magnetic field compensation, without having to provide a separated magnetic compensation coil 160. In yet another embodiment, four detection air chambers 130 may share one group of magnetic compensation coils 160.

It should be noted that those skilled in the art should understand that the number of the detection air chambers 130 is not limited to four, but may also be three, five, six, etc., as long as they are symmetrically arranged relative to the center of the light splitting member 110. In this embodiment, the four detection air chambers 130 being arranged evenly spaced and symmetrically is beneficial to simplifying the structures of the light splitting member 110, the polarization device 120, and the like.

In another embodiment, the plurality of detection air chambers 130 are centrally symmetrical arranged, and several of the detection air chambers 130 may be adjacent to each other instead of being arranged evenly spaced.

Figure 3:
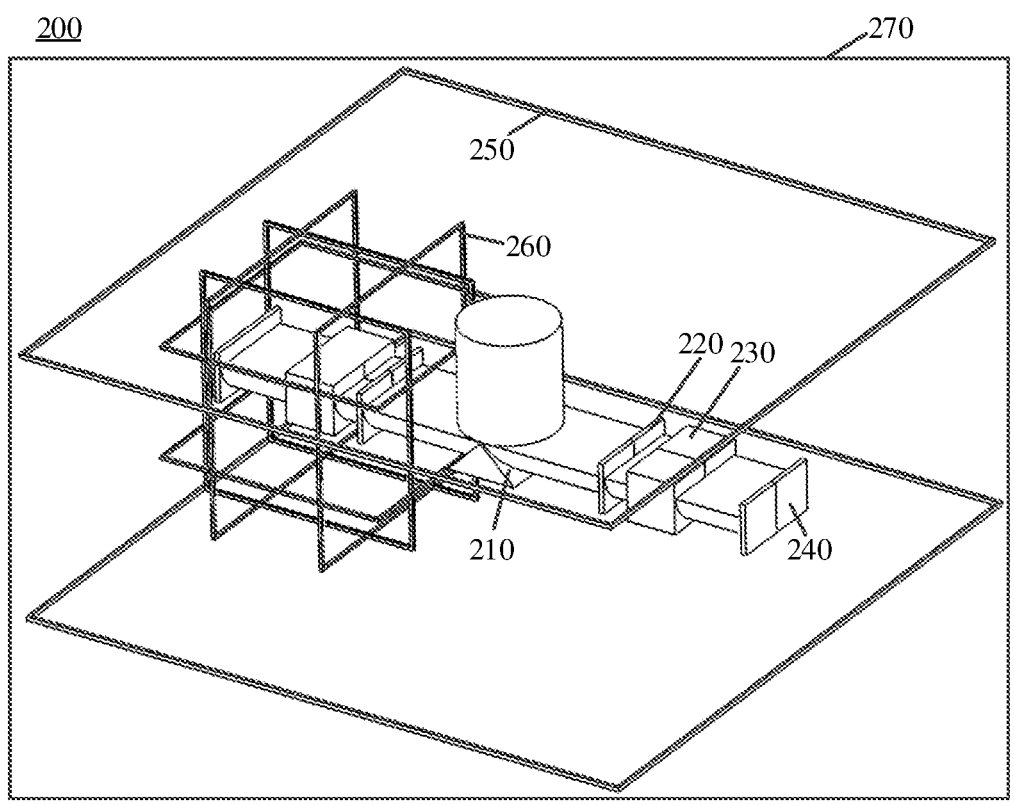
FIG. 3 illustrates a perspective view of an atomic magnetic detector according to another embodiment of the present disclosure.

FIG. 3 illustrates a perspective view of an atomic magnetic detector 200 according to another embodiment of the present disclosure.

As illustrated in FIG. 3, similar to the atomic magnetic detector 100 illustrated in FIGS. 1A and 2, the atomic magnetic detector 200 includes a detection assembly, the detection assembly includes a light splitting member 210, a polarization device 220, a detection air chamber 230, a photoelectric detector 240, a modulation coil 250, a magnetic compensation coil 260, and a housing 270. The housing 270 accommodates the light splitting member 210, the polarization device 220, the detection air chamber 230, the photoelectric detector 240, the modulation coil 250 and the magnetic compensation coil 260. In order to avoid obscuring important aspects of the present disclosure, the same or similar components as those of the atomic magnetic detector 100 according to the first embodiment will not be described in detail.

It should be noted that in other embodiments, the atomic magnetic detector 200 may include a plurality of detection assemblies, and the housing 270 accommodates the plurality of detection assemblies.

What is different from the atomic magnetic detector 100 illustrated in FIG. 2 is, the atomic magnetic detector 200 has four detection air chambers 230 arranged on the same plane, and the four detection air chambers 230 are arranged axisymmetrically relative to the light splitting member 210, wherein two detection air chambers 230 are adjacent to each other and the other two detection air chambers 230 are adjacent to each other.

In this embodiment, the housing 270 of the atomic magnetic detector 200 includes a plurality of detection air chambers 230, which effectively realizes multi-channel magnetic intensity or magnetic gradient detection. Because the plurality of detection air chambers 230 are axisymmetrically arranged relative to the same light splitting member 210 and receive light split from the same light splitting member 210, the detection density is significantly improved, and the relative positions of a plurality of detection air chambers 230 in the same atomic magnetic detector 200 are ensured to be fixed and stable. In addition, this axisymmetric arrangement has simple design and low assembly and manufacturing costs.

Similar to the atomic magnetic detector 100 in the first embodiment, the atomic magnetic detector 200 according to this embodiment further includes a laser light source (not illustrated in FIG. 3) and a collimating device (not illustrated in FIG. 3). The laser light source generates a polarized light beam, and the light source interface is used for receiving the polarized light beam collimated by the collimating device and transmitting it to the light splitting member 210. The light splitting member 210 divides the received polarized light beam into four light beams and distributes them to four detection air chambers 230 which are axisymmetric to each other, so that each detection air chamber 230 receives a polarized light beam.

In another example, the light splitting member 210 may also split the polarized light beam emitted by the laser light source into two wide light beams and distribute the two wide light beams to two sides respectively, so that each polarized light beam is simultaneously distributed to two detection air chambers 230 located on the same side. Here, "wide light beam" means the broadened beam, and "wide polarized light beam" means the broadened polarized light beam.

In yet another example, the atomic magnetic detector 200 may also include two laser light sources and generate two polarized light beams, each polarized light beam of the two polarized light beams is distributed by the light splitting member 210 into two detection air chambers 230 that are axisymmetric with each other, so that each detection air chamber 230 receives one polarized light beam.

The four detection air chambers 230 axisymmetrically arranged relative to the light splitting member 210 all or partially receive the light of the same polarized light beam from the same laser light source, thus reducing the number and cost of laser light sources, reducing the volume occupied by the atomic magnetic detector 200 to make it have higher detection density, eliminating or reducing the noise difference among the plurality of light sources when using their respective laser light sources, and improving the noise reduction efficiency. Preferably, in the above example using one laser light source, the four detection air chambers 230 axisymmetrically arranged relative to the light splitting member 210 all receive the light of the same polarized light beam from the same laser light source, so that the number and cost of the laser light sources and the volume occupied by the atomic magnetic detector 200 are further reduced and the noise reduction efficiency is further improved.

As illustrated in FIG. 3, the light splitting member 210 may be a prism having two inclined planes of 45 degrees, each inclined plane facing two adjacent detection air chambers 230, so that the light splitting member 210 reflects the received polarized light beam propagating in the vertical direction into the plurality of polarized light beams propagating in the horizontal direction at right angles to the vertical direction and distributes each polarized light beam to the corresponding detection air chambers 230.

The detection air chamber 230 contains alkali metal gas. There are four photoelectric detectors 240, and each photoelectric detector 240 is arranged behind each detection air chamber 230 on the optical path, and is also axisymmetric relative to the light splitting member 210. There are four polarization devices 220, and each polarization device 220 is arranged between the light source assembly and the detection air chamber 230 on the optical path, for converting the polarized light beam to be guided to the detection air chamber 230 into a circularly polarized light beam.

In another example, two adjacent detection air chambers 230 located on the same side may share one same polarization device 220.

In this embodiment, four detection air chambers 230 share one group of modulation coils 250. Therefore, the use cost of coils can be reduced, and the crosstalk between the plurality of modulation coils 250 generated when each detection air chamber 230 uses separated modulation coil 250 can also be eliminated, so that the detection air chambers 230 in the atomic magnetic detector 200 can be closer to each other. Compared with the traditional single-channel atomic magnetic detector, the atomic magnetic detector 200 according to this embodiment has high detection density and small occupied volume.

It should be noted that those skilled in the art should understand that the number of the detection air chambers 230 is not limited to four, but may also be other numbers, such as two, six, etc., as long as they are axisymmetrically arranged relative to the light source assembly.

In another embodiment, the two adjacent detection air chambers 230 located on one side may also be integrated into one integrated detection air chamber. That is, in this embodiment, two integrated detection air chambers are arranged axisymmetrically relative to the light source assembly. In this embodiment, the atomic magnetic detector includes one light source which generates one polarized light beam, and the light splitting member distributes the polarized light beam to each integrated detection air chamber respectively, so that each detection air chamber receives one wide polarized light beam, which is transmitted to two photoelectric detectors located behind the corresponding integrated detection air chamber through the corresponding integrated detection air chamber. Therefore, each integrated detection air chamber may realize the detection at two points, and further improve the detection density.

In other examples where two adjacent detection air chambers 230 located at one side are integrally combined into one integrated detection air chamber, the atomic magnetic detector may include two laser light sources and generate two polarized light beams, each polarized light beam of the two polarized light beams is distributed to the integrated detection air chambers located at both sides by the light splitting member 210, so that each integrated detection air chamber receives two polarized light beams, which are transmitted to two photoelectric detectors located behind the corresponding integrated detection air chamber through the corresponding integrated detection air chambers.

In another embodiment, the atomic magnetic detector may further include another detection assembly in a different plane from the detection assembly in the atomic magnetic detector 100 or the detection assembly in the atomic magnetic detector 200 as described above.

Figure 4:
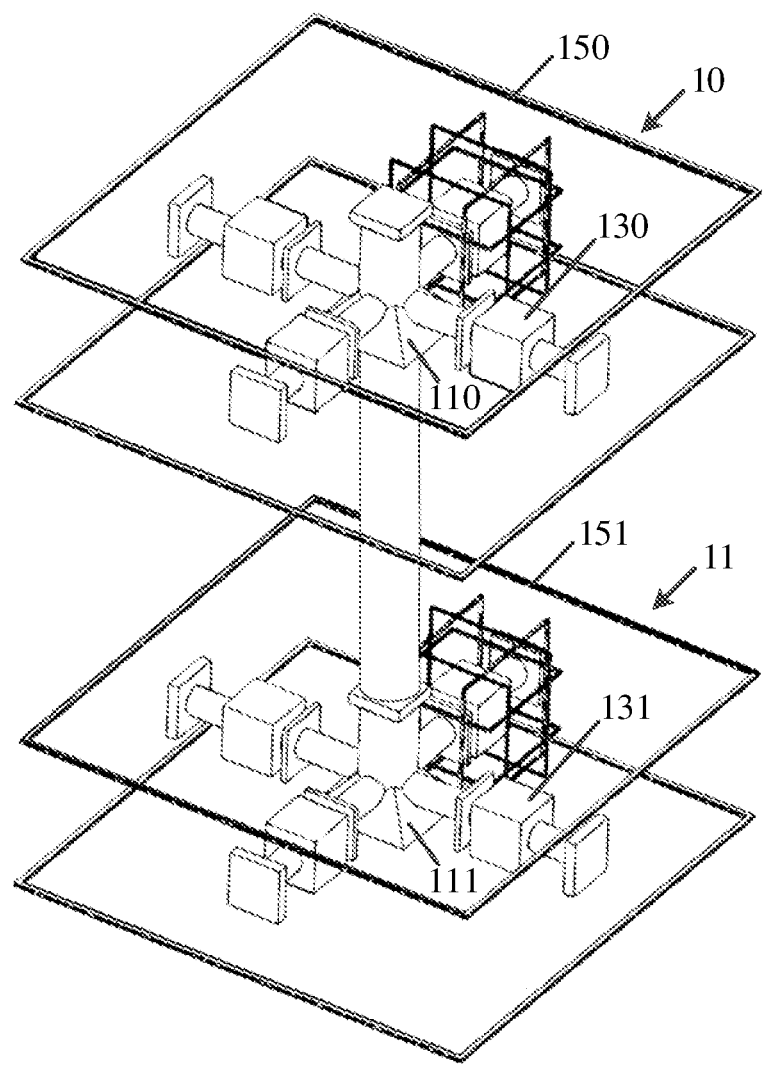
FIG. 4 illustrates an atomic magnetic detector according to yet another embodiment of the present disclosure.

FIG. 4 illustrates an atomic magnetic detector according to yet another embodiment of the present disclosure. As illustrated in FIG. 4, the atomic magnetic detector is similar to the atomic magnetic detector 100. The difference between them is that the atomic magnetic detector includes not only the detection assembly 10 including the light splitting member 110, the polarization device 120, the detection air chamber 130, the photoelectric detector 140, the modulation coil 150 and the magnetic field compensation coil 160, but also another detection assembly 11 on another plane parallel to and offset from the detection assembly. The other detection assembly 11 also includes a light splitting member 111, a polarization device, a photoelectric detector, a modulation coil 151, a compensation coil and four detection air chambers 131 symmetrically arranged relative to the center of the light source assembly. Therefore, the detection density of the atomic magnetic detector is further improved. The four detection air chambers 131 may be arranged in alignment with the four detection air chambers 130 respectively, but the present disclosure is not limited thereto. It should be understood that the detection assemblies are not limited to two, but may be more, and each detection assembly need not be arranged identically.

In this embodiment, the detection air chambers in each detection assembly share the same laser light source. Therefore, the use quantity and cost of laser light sources are further reduced, and the occupied volume of the atomic magnetic detector is reduced, so that it has higher detection density.

In addition, each of the two detection assemblies has one light splitting member 110, 111, and the two light splitting members 110, 111 incident the same polarized light beam from the same light source to each detection air chamber 130, 131 in each detection assembly. Among them, the light splitting member 110 of the preceding detection assembly 10 on the optical path may have a transflective property, which reflects a part of the received polarized light beam to each detection air chamber 130 of the detection assembly 10 while allowing the other part of the received polarized light beam to be transmitted to another light splitting member 111.

The two detection assemblies 10, 11 also each have one group of modulation coils 150, 151. The two groups of modulation coils 150, 151 are offset by a certain distance to avoid crosstalk.

In yet another embodiment, the atomic magnetic detector may further include another detection assembly in the same plane as the detection assembly in the atomic magnetic detector 100 or the detection assembly in the atomic magnetic detector 200 described above and offset from the atomic magnetic detector 100 or the detection assembly in the atomic magnetic detector 200 in the plane.

Figure 5:
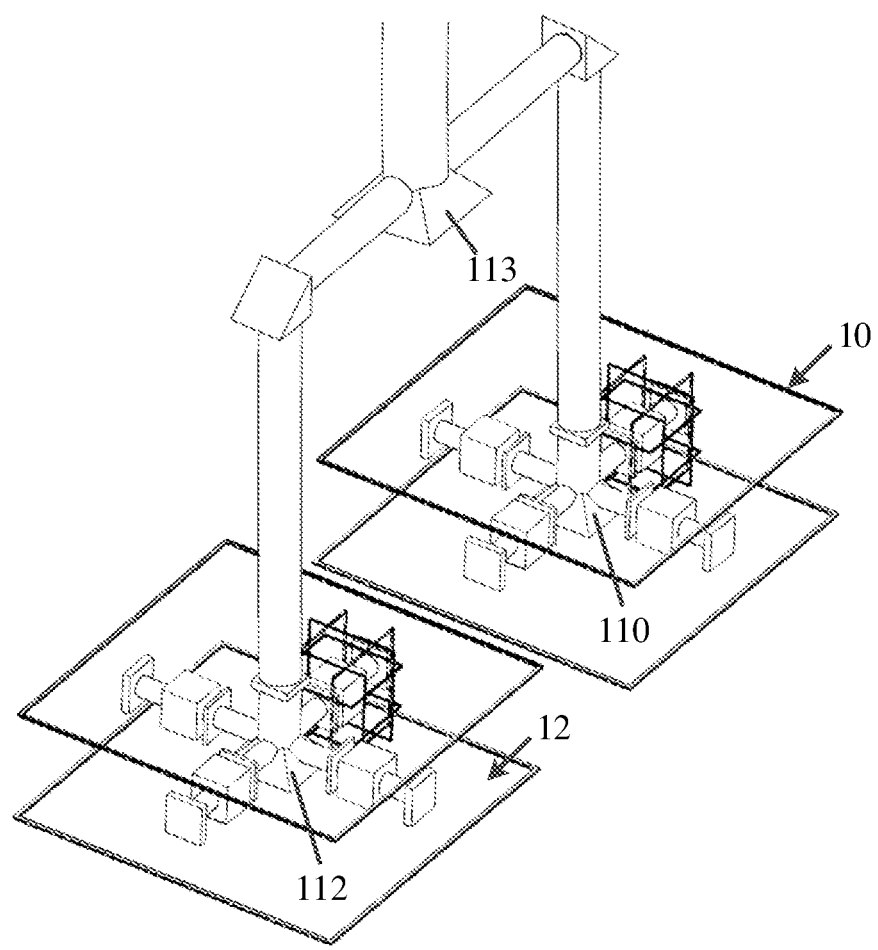
FIG. 5 illustrates an atomic magnetic detector according to still another embodiment of the present disclosure.

FIG. 5 illustrates an atomic magnetic detector according to still another embodiment of the present disclosure. The atomic magnetic detector is similar to the atomic magnetic detector 100. The difference between them is that the atomic magnetic detector includes not only one detection assembly 10 including the light splitting member 110, the polarization device 120, the detection air chamber 130, the photoelectric detector 140, the modulation coil 150 and the magnetic field compensation coil 160, but also another detection assembly 12 which is on the same plane as the detection assembly 10 and offset from it in the plane. The two detection assemblies 10, 12 may be the same or different.

In this embodiment, the detection assemblies 10, 12 share the same laser light source. That is, the light splitting members 110, 112, 113 of the two detection assemblies 10, 12 distribute the same polarized light beam from the same light source to each detection air chamber. Specifically, the polarized light beam generated by the laser light source is split by the additional light splitting member 113, and the resulted light beam enters the light splitting members 110, 112 in the two detection assemblies 10, 12, and then is distributed to each detection air chamber in the two detection assemblies 10, 12 through the light splitting members 110, 112. Therefore, the use quantity and cost of laser light sources are further reduced, and the occupied volume of the atomic magnetic detector is reduced, so that it has higher detection density.

In other examples, the two detection assemblies 10, 12 may respectively use separated laser light sources.

The scope of the present disclosure is not limited by the embodiments described above, but by the appended claims and their equivalents.

The invention claimed is:

1. A multi-channel atomic magnetic detector, comprising:
   at least one detection assembly, each detection assembly comprising:
   a plurality of detection air chambers on a same plane; and
   a light splitting member for distributing a polarized light beam from a light source to the plurality of detection air chambers,
   wherein the plurality of detection air chambers of each detection assembly are symmetrically or axisymmetrically arranged relative to a center of the light splitting member.

2. The multi-channel atomic magnetic detector according to claim 1,
   wherein the light splitting member is used for distributing a polarized light beam from a same light source to each detection air chamber in the detection assembly.

3. The multi-channel atomic magnetic detector according to claim 1,
   wherein at least a part of the plurality of detection air chambers receive two polarized light beams or a broadened wide polarized light beam.

4. The multi-channel atomic magnetic detector according to claim 1, further comprising:
   a housing for accommodating the at least one detection assembly.

5. The multi-channel atomic magnetic detector according to claim 4,
   wherein the light source is accommodated within the housing.

6. The multi-channel atomic magnetic detector according to claim 4,
   wherein the light source is arranged outside the housing.

7. The multi-channel atomic magnetic detector according to claim 1,
   wherein each detection assembly comprises:
   a plurality of photoelectric detectors for detecting information of a polarized light beam passing through the corresponding detection air chamber, the plurality of photoelectric detectors being arranged behind the corresponding detection air chambers on an optical path, and being also symmetrical or axisymmetric relative to the center of the light splitting member.

8. The multi-channel atomic magnetic detector according to claim 1,
   wherein each detection assembly comprises:
   a plurality of polarization devices for converting a polarized light beam into a circularly polarized light beam, which are arranged between the light splitting member and the corresponding detection air chamber on an optical path and are also symmetrical or axisymmetric relative to the center of the light splitting member.

9. The multi-channel atomic magnetic detector according to claim 1,
   wherein each detection assembly comprises:
   a modulation coil, and the plurality of detection air chambers of each detection assembly share a same group of modulation coils.

10. The multi-channel atomic magnetic detector according to claim 1,
    wherein each detection assembly comprises:
    a plurality of groups of modulation coils, each group of modulation coils is arranged for each detection air chamber and is cooperatively controlled by a common controller.

11. The multi-channel atomic magnetic detector according to claim 1,
    wherein the atomic magnetic detector comprises two or more detection assemblies, the two or more detection assemblies are respectively arranged on different planes which are parallel to each other and offset from each other.

12. The multi-channel atomic magnetic detector according to claim 1,
    wherein the atomic magnetic detector comprises two or more detection assemblies, the two or more detection assemblies are arranged on the same plane and offset from each other in the plane.

13. The multi-channel atomic magnetic detector according to claim 11,
    wherein the light splitting members of the two or more detection assemblies distribute a common polarized light beam from a common light source to each detection air chamber.

14. The multi-channel atomic magnetic detector according to claim 1,
    wherein each detection assembly comprises four detection air chambers which are evenly spaced and symmetrically arranged relative to the light splitting member on the same plane.

15. The multi-channel atomic magnetic detector according to claim 1,
    wherein each detection assembly comprises two detection air chambers which are axisymmetrically arranged relative to the light splitting member on the same plane.

16. The multi-channel atomic magnetic detector according to claim 1,
    wherein each detection assembly comprises four detection air chambers which are axisymmetrically arranged on two sides of the light splitting member on the same plane, wherein two detection air chambers on one side are adjacent to each other and two detection air chambers on the other side are adjacent to each other.

17. The multi-channel atomic magnetic detector according to claim 12,
    wherein the light splitting members of the two or more detection assemblies distribute a common polarized light beam from a common light source to each detection air chamber.

* * * * *